United States Patent
Michaud et al.

(10) Patent No.: US 9,763,354 B1
(45) Date of Patent: Sep. 12, 2017

(54) CYLINDRICAL FORM COMPUTER DATA CENTER RACK

(71) Applicant: MacStadium, Inc., Atlanta, GA (US)

(72) Inventors: Jason A. Michaud, Marietta, GA (US); Michael L. Oken, Atlanta, GA (US); Gregory P. McGraw, Marietta, GA (US)

(73) Assignee: MACSTADIUM, INC., Atlanta, GA (US)

( * ) Notice: Subject to any disclaimer, the term of this patent is extended or adjusted under 35 U.S.C. 154(b) by 0 days.

(21) Appl. No.: 15/174,562

(22) Filed: Jun. 6, 2016

Related U.S. Application Data (63) Continuation of application No. 29/529,389, filed on Jun. 5, 2015, now Pat. No. Des. 761,246.

(60) Provisional application No. 62/171,856, filed on Jun. 5, 2015.

(51) Int. Cl.
*A47F 7/00* (2006.01)
*H05K 7/14* (2006.01)
*H05K 7/20* (2006.01)

(52) U.S. Cl.
CPC ....... *H05K 7/1488* (2013.01); *H05K 7/20709* (2013.01)

(58) Field of Classification Search
CPC ............ H05K 7/20736; H05K 7/1489; H05K 7/20709; H05K 7/1488; H05K 7/1485; H04Q 1/02; H04Q 2201/02; G06F 1/1601; G06F 1/1613; A47B 47/00; A47B 47/0083; A47B 2097/006; A47F 7/0042; A47F 7/0028; A47F 7/0035; H01L 21/6734; H02J 7/0044; H02J 7/0045

USPC ........ 211/26.2, 26, 134, 187, 186, 191, 190, 211/41.17, 10, 40, 41.12; 361/724, 728, 361/829, 807, 809, 810, 679.49, 679.5; 248/235, 309.1, 675; 312/223.2, 223.3; 320/114, 115

See application file for complete search history.

(56) References Cited

U.S. PATENT DOCUMENTS

| | | | | |
|---|---|---|---|---|
| 3,767,059 A | * | 10/1973 | Seiz | B65G 1/02 211/149 |
| 3,798,507 A | * | 3/1974 | Damon | H05K 7/1425 211/41.17 |
| 4,019,099 A | * | 4/1977 | Calabro | H05K 7/1418 211/41.17 |
| 4,327,835 A | * | 5/1982 | Leger | H05K 7/1425 211/41.17 |
| 4,335,819 A | * | 6/1982 | Weisman | H05K 7/1418 211/41.17 |

(Continued)

*Primary Examiner* — Jennifer E Novosad
(74) *Attorney, Agent, or Firm* — Morris, Manning & Martin, LLP; John R. Harris; R. Lee Strasburger, Jr.

(57) ABSTRACT

A mounting arrangement for mounting and supporting a plurality of cylindrical form or other computer systems having specialized physical form, for example Apple Mac Pro computer systems, in a data center, so as to optimize placement, cooling air flow, access to cabling, and maximizing use of space. The disclosed arrangement provide for mounting up to 16 Mac Pro computers or similar devices on a single shelf, in a horizontal position, up to 8 shelves, for a total of up to 128 Mac Pro computers in a single rack assembly, with accessibility from both sides of the rack, and convenient arrangements for power and communications cabling, as well as generally vertical cooling air flow.

15 Claims, 10 Drawing Sheets

(56) References Cited

U.S. PATENT DOCUMENTS

| | | | | |
|---|---|---|---|---|
| 4,407,416 | A * | 10/1983 | Anderson | H05K 7/183 211/183 |
| 4,476,986 | A * | 10/1984 | Robinson | A47F 5/005 211/134 |
| 4,501,368 | A * | 2/1985 | Gill | H05K 7/1425 211/186 |
| 4,519,016 | A * | 5/1985 | Bradley | H05K 7/1425 211/41.17 |
| 4,758,928 | A * | 7/1988 | Wierec | H05K 7/1455 211/41.17 |
| 4,802,593 | A * | 2/1989 | Romanos | B43M 99/00 211/10 |
| 4,866,576 | A * | 9/1989 | Umetsu | H05K 7/1425 211/41.17 |
| 4,955,490 | A * | 9/1990 | Schafer | A47B 96/02 211/187 |
| 4,995,682 | A * | 2/1991 | Gutner | A47B 88/0455 206/387.15 |
| 5,044,506 | A * | 9/1991 | Brown | H05K 7/1425 211/26 |
| 5,297,684 | A * | 3/1994 | Meunier | H05K 7/1412 138/173 |
| 5,394,305 | A * | 2/1995 | Moral | H05K 7/1425 211/41.17 |
| 5,398,822 | A * | 3/1995 | McCarthy | H05K 7/1414 211/41.17 |
| 5,590,794 | A * | 1/1997 | Zachary | B07C 7/02 209/702 |
| 5,757,617 | A * | 5/1998 | Sherry | G06F 1/184 206/387.15 |
| 5,823,332 | A * | 10/1998 | Clausen | G11B 33/0433 206/307.1 |
| 5,890,606 | A * | 4/1999 | Kuipers | H01M 2/1077 211/186 |
| 5,892,662 | A * | 4/1999 | Verma | H05K 7/1425 211/41.17 |
| 5,912,799 | A * | 6/1999 | Grouell | G11B 33/126 312/223.2 |
| 6,008,621 | A * | 12/1999 | Madison | H02J 7/0042 320/107 |
| 6,482,541 | B1 * | 11/2002 | Bator, Jr. | H01M 2/1077 429/100 |
| 6,719,150 | B2 * | 4/2004 | Marraffa | H01M 2/1077 211/26 |
| 7,055,704 | B2 * | 6/2006 | Alter | A47B 57/50 108/51.11 |
| 7,548,429 | B2 * | 6/2009 | Miller | H01M 2/1077 361/724 |
| 7,595,995 | B2 * | 9/2009 | Hock | G06F 1/263 312/223.2 |
| 8,238,082 | B2 * | 8/2012 | Salpeter | H05K 7/1488 361/679.02 |
| 8,376,157 | B2 * | 2/2013 | Jarvis | A47B 47/045 108/147.12 |
| 8,443,992 | B2 * | 5/2013 | Lawson | A47B 47/024 211/187 |
| 8,490,800 | B2 * | 7/2013 | Noble Colin | A47F 5/0087 211/150 |
| 8,684,191 | B2 * | 4/2014 | Hosey | H05K 7/1424 211/41.17 |
| 8,752,848 | B2 * | 6/2014 | Petrick | H01R 13/465 280/47.35 |
| 9,411,525 | B2 * | 8/2016 | Frink | G06F 1/187 |
| 2002/0006026 | A1 * | 1/2002 | Takahashi | H05K 7/1418 361/679.46 |
| 2004/0040922 | A1 * | 3/2004 | Ko | A47B 81/04 211/153 |
| 2004/0057216 | A1 * | 3/2004 | Smith | G06F 1/3287 361/724 |
| 2004/0155003 | A1 * | 8/2004 | Anderson | A47F 5/01 211/191 |
| 2004/0195195 | A1 * | 10/2004 | Mason | A47F 5/0018 211/134 |
| 2005/0146855 | A1 * | 7/2005 | Brehm | H05K 7/1454 361/724 |
| 2006/0131252 | A1 * | 6/2006 | Tobias | A47B 65/10 211/184 |
| 2006/0261025 | A1 * | 11/2006 | Heyderman | A47F 5/118 211/187 |
| 2008/0244052 | A1 * | 10/2008 | Bradicich | G06F 1/183 709/223 |
| 2012/0325763 | A1 * | 12/2012 | Loy | A47F 5/0043 211/134 |
| 2013/0164586 | A1 * | 6/2013 | Uchida | A47F 5/00 429/96 |
| 2013/0175993 | A1 * | 7/2013 | Chen | H02J 7/0027 320/114 |
| 2014/0091696 | A1 * | 4/2014 | Welker | A47F 5/0043 312/408 |
| 2014/0175031 | A1 * | 6/2014 | Roberts | H02J 7/0027 211/26.2 |
| 2015/0129514 | A1 * | 5/2015 | Bourdoncle | H05K 7/20727 211/26 |
| 2016/0113421 | A1 * | 4/2016 | Muzyka | A47B 47/0083 211/85.26 |

\* cited by examiner

CYLINDRICAL FORM COMPUTER DATA CENTER RACK

CROSS-REFERENCE TO RELATED APPLICATIONS

This application claims benefit under 35 U.S.C. §119(e) of U.S. Provisional Patent Application No. 62/171,856, filed Jun. 5, 2015, entitled "CYLINDRICAL FORM COMPUTER DATA CENTER RACK", and U.S. Design patent application No. 29/529,389, filed Jun. 5, 2015, entitled "ENCLOSURE FOR COMPUTER DATA CENTER RACK", both of which are incorporated herein by reference as set forth herein in their entirety.

TECHNICAL FIELD

The present disclosure relates generally to the field of storing and organizing large scale computer systems, and more specifically relates to computer center data racks for storing and organizing computer systems having a cylindrical form factor such as an APPLE® Mac Pro.

BACKGROUND

Computer data centers are facilities that contain racks or shelves of computer systems and their associated components such as power supplies and telecommunications systems. Large data centers house hundreds, often thousands, of separate computers, which are connected for communications with computers in the data center and with telecommunication networks such as the Internet, thereby forming the essential infrastructure of "cloud computing." The racks of computers often extend from floor to ceiling, mounted atop hollow flooring structures called plenums that route cooling air to the various racks, with heat removal vents positioned above the racks. A facility housing thousands of computers uses many kilowatts of electricity and generates large amounts of heat that must be removed so that the computers can operate within their specified ranges of operating temperatures.

Space, cooling, power cabling, and communications cabling requirements are therefore critical for modern data centers. Floor space in terms of square feet footprint per rack and height requirements for each rack of computers are limited, so as to provide required cooling air and power requirements, as well as security within physical cages and accessibility for configuration and maintenance.

One particular type of computer that is popular for certain computing applications is the APPLE® Mac Pro, manufactured by Apple, Inc., Cupertino, Calif. The Mac Pro is considered a workstation or server computer but does not include a display, keyboard, or mouse. Although the Mac Pro computer is not typically considered to be a data center type computer device, it possesses certain features that make it desirable for deployment in data centers.

For example, the Mac Pro computer's processor and associated internal peripheral circuitry make it highly suitable for hosting development environments for the APPLE® computing infrastructure and environment, which is built around the OS X operating system for enterprise and personal computing, and the iOS operating system for mobile devices from Apple, Inc., such as the iPhone and iPad. Other conventional types of computer systems, because they lack the unique circuitry and components of the Apple computing environment, are not readily capable of running OS X or certain iOS development platforms. Thus, the Mac Pro computer is highly capable of serving data center needs for conventional data center computing requirements, as well as specialized service to the OS X and iOS development communities.

In contrast, however, the cylindrical form of the Mac Pro computer is not readily suitable for deployment in data centers. The Mac Pro computer is manufactured in a cylindrical form that is configured to be oriented in an upright position, which minimizes the footprint of the Mac Pro computer on a desk. Further, the Mac Pro computer is manufactured with one internal thermal core at its center and a single fan positioned at its top end (when oriented upright) that draws air up through the bottom end of the Mac Pro computer, past the thermal core, and out the top of the Mac Pro computer. Finally, the Mac Pro computer is manufactured with one panel containing controls and communication and power ports for the Mac Pro computer, which extends axially along an arc on the circumference of the cylindrical form.

As a result of increasing demand by the OS X and iOS developers' community, there is a need for a data center that can efficiently house computer systems that can provide OS X-compatible hosting environments, as well as other cloud-based computing requirements. The present disclosure relates to a highly space and thermal-efficient data center computer rack mounting arrangement that provides for maximized usage of Mac Pro computers.

BRIEF SUMMARY OF THE DISCLOSURE

Briefly described, and according to one embodiment, aspects of the present disclosure generally relate to a cylindrical form computer mounting arrangement allows mounting of up to 16 Mac Pro computers or similar devices on a single shelf, up to 8 shelves, for a total of up to 128 Mac Pro computers in a single rack assembly, with accessibility from both sides of the rack, and convenient arrangements for power and communications cabling, as well as generally vertical cooling air flow.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein:

FIG. 2, consisting of FIGS. 2A through 2D, show details of a complete mounting shelf with cylindrical form enclosures seated at each of 14 separate mounting locations.

FIG. 3, consisting of FIGS. 3A through 3D, show details of a cylindrical form enclosure, 14 of which are seated on each shelf of FIG. 2.

DETAILED DESCRIPTION

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Aspects of the present disclosure generally relate to a cylindrical form computer mounting arrangement in the form of a rack assembly 10. The disclosed rack assembly 10 allows mounting of up to 16 Mac Pro computers or similar devices on a single shelf 15, up to 8 shelves, for a total of up to 128 Mac Pro computers in a single rack assembly 10, with accessibility from both sides of the rack, and convenient arrangements for power and communications cabling, as well as generally vertical cooling air flow.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

Figure 1:
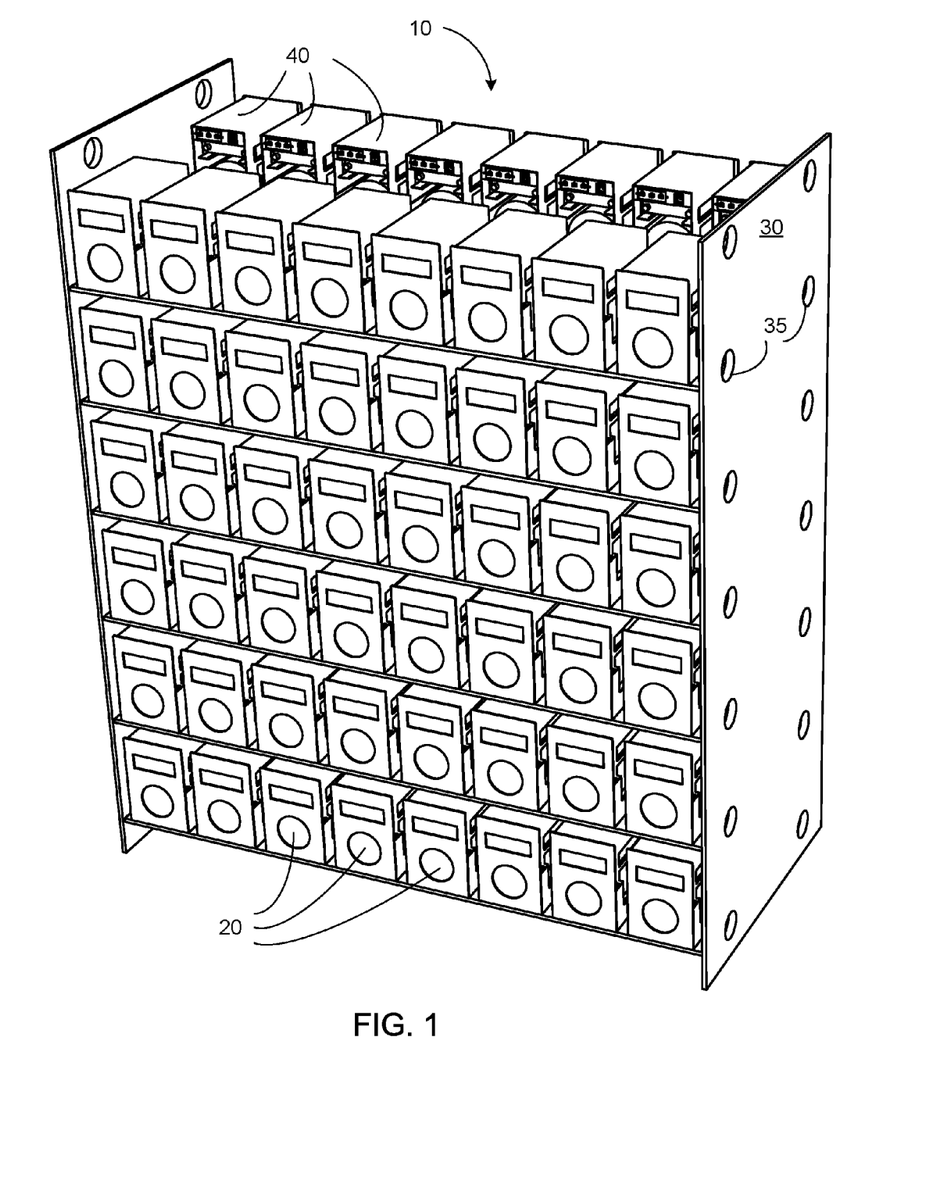
FIG. 1 illustrates a data center mounting rack in accordance with this disclosure, perspective view, front side, populated with 48 Mac Pro computers on each side.

Now referring to the figures, FIG. 1 illustrates a data center mounting rack 10 in accordance with this disclosure, perspective view, front side, populated with 48 Mac Pro computers 20 on each side. According to one embodiment, the data center mounting rack 10 may hold 96 Mac Pro computers oriented parallel to the shelves 15. In one embodiment, the shelves may hold 16 Mac Pro computers. In various embodiments, the data center mounting rack comprises 6 shelves spaced equidistant from each other within the data center mounting rack. As will be appreciated by one having ordinary skill in the art, the number of shelves (and height of the data center mounting rack) may be modified to accommodate the requirements of the data center. For example, in one embodiment, the data center mounting rack may comprise 8 shelves 15 (and therefore may hold up to 128 Mac Pro computers). In another embodiment, the data center mounting rack may comprise 5 shelves (and therefore may hold up to 80 Mac Pro computers).

Still referring to FIG. 1, in one embodiment, the shelves may be spaced far enough apart to provide for adequate airflow between the Mac Pro computers (e.g., sufficient airflow to keep the Mac Pro computers operating within their optimal temperature range). As will be appreciated by one having ordinary skill in the art, if the Mac Pro computers are not cooled adequately, then they will overheat and operate inefficiently, which, considering the one internal thermal core and single fan, may happen very easily. In one embodiment, the shelves 15 are configured to accommodate for airflow from within the interior of the rack through the Mac Pro and out towards the exterior of the rack. In various embodiments, the shelves may be spaced far enough apart to provide adequate space for the various cables (e.g., power, network, etc.) that are necessary to operate the Mac Pro computers as servers. In one embodiment, the cables connect to the side of the Mac Pro computers, run out the back of the cylindrical form enclosures 40, and run in the middle space of the shelves 15 and out holes 35 in the sides or side panels 30 of the data center mounting rack.

Figure 2A:
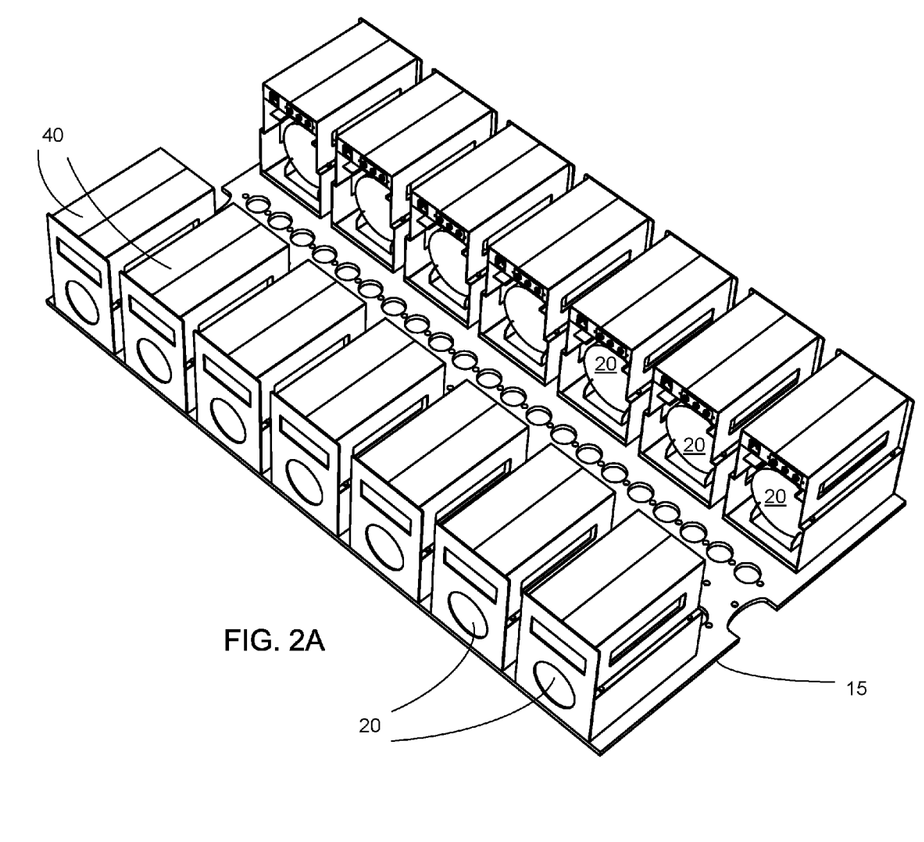
Figure 2B:
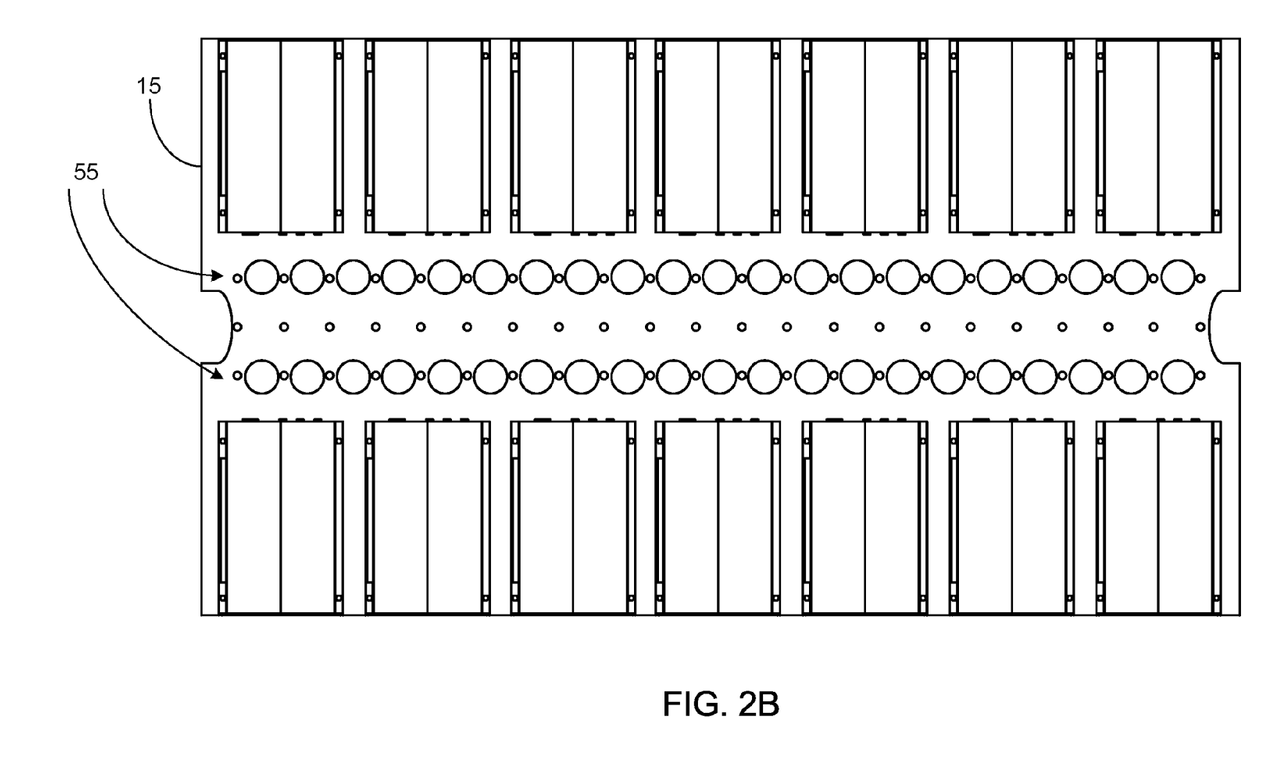
Figure 2C:
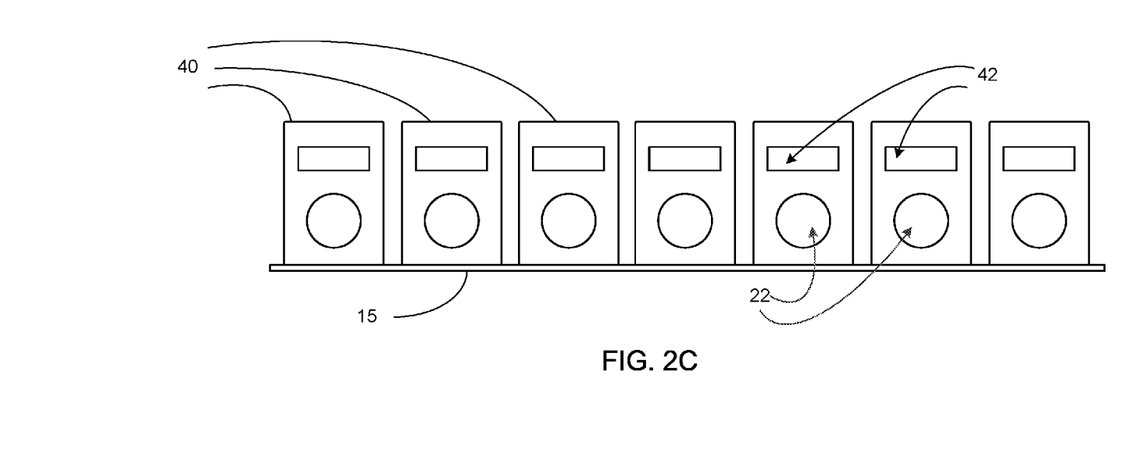
Figure 2D:
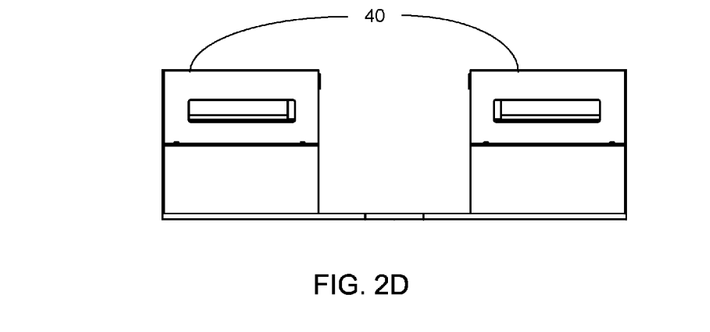

FIG. 2, consisting of FIGS. 2A through 2D, show details of a complete mounting shelf 15 with cylindrical form enclosures 40 seated at each of 14 separate mounting locations. Generally, in various embodiments, the cylindrical form enclosures 40 may be welded to the shelves directly in front of the larger holes. According to one embodiment, the cylindrical form enclosures 40 are each further attached to a peg that forms a part of the shelf, provides for additional stability, and ensures adequate spacing of the cylindrical form enclosures. In another embodiment, the enclosures are not welded to the shelves but instead include two posts (not shown in the figures) on opposites sides of the bottom towards the front of the enclosure that are accepted by two corresponding holes in the mounting shelf (not shown in the figures), which seats the cylindrical form enclosure on the mounting shelf and aligns and orients the cylindrical form enclosure. In various embodiments, the cylindrical form enclosures 40 are mounted on opposites sides of the shelf (as illustrated in FIG. 2D). As will be appreciated by one having ordinary skill in the art, this configuration promotes adequate air flow and provides a location for the cables.

Referring now to FIG. 3, consisting of FIGS. 3A through 3D, which show details of a cylindrical form enclosure 40, 14 of which are seated on each shelf of FIG. 2. Generally, in various embodiments, the cylindrical form enclosure is a hollow cuboid that is large enough for a Mac Pro computer to sit, on its side, completely within it. In various embodiments, the cylindrical form enclosure may include a shelf 72 on which a network adapter (e.g., universal fibre channel adapter, etc.) sits. In one embodiment, the universal fibre channel adapter permits the Mac Pro computer to access more power, commercially available storage area networks (e.g., SAN arrays provided by NetApps or EMC) than would be available through its proprietary on-board adapter. In various embodiments, the cylindrical form enclosures are large enough to hold, in addition to a Mac Pro and a network adapter, all of the additional cables necessary to operate the Mac Pro as a server (e.g., power adapters, network cables, etc.). According to one embodiment, the cylindrical form enclosure 40 includes ports for connecting the network adapter to a network and for providing power to the network adapter and Mac Pro computer.

According to various embodiments, the sideways orientation of the Mac Pro computer 20 within the cylindrical form enclosure 40 enables the rack to hold more Mac Pro computers within a given space considering the thermal dissipation demands of the Mac Pro computers. According to one embodiment, the cylindrical form enclosure may be designed to minimize the impact of the inefficient use of vertical space in the Mac Pro computer and the single fan that draws airflow from the bottom of the Mac Pro computer through to the top.

Figure 3A:
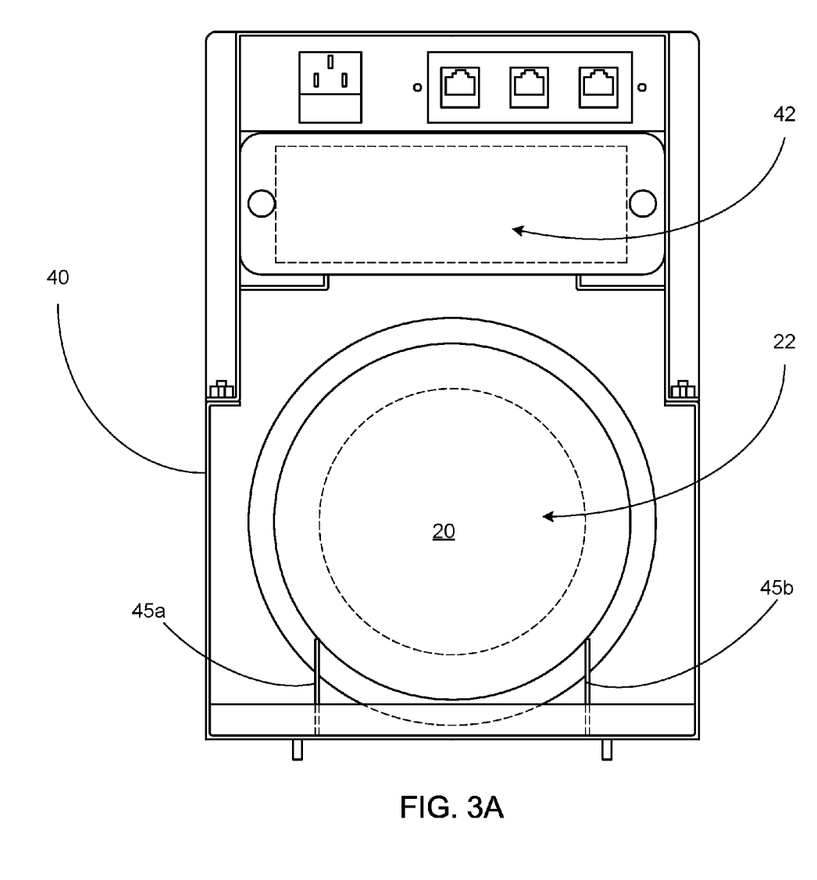
Figure 3B:
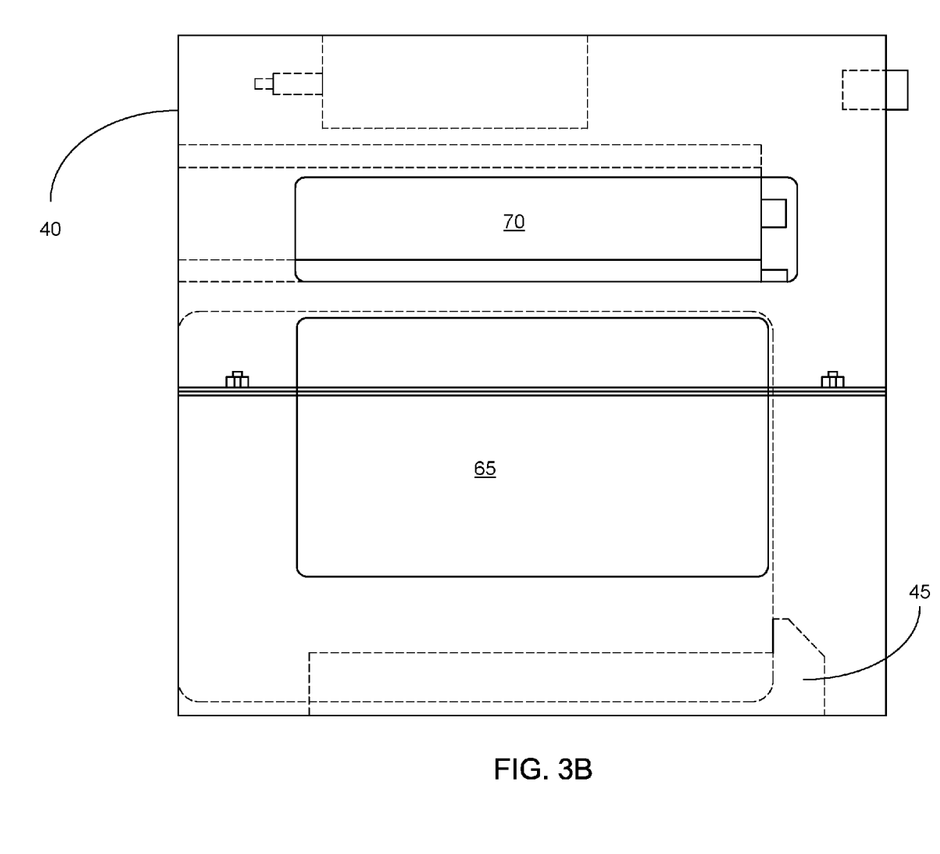
Figure 3C:
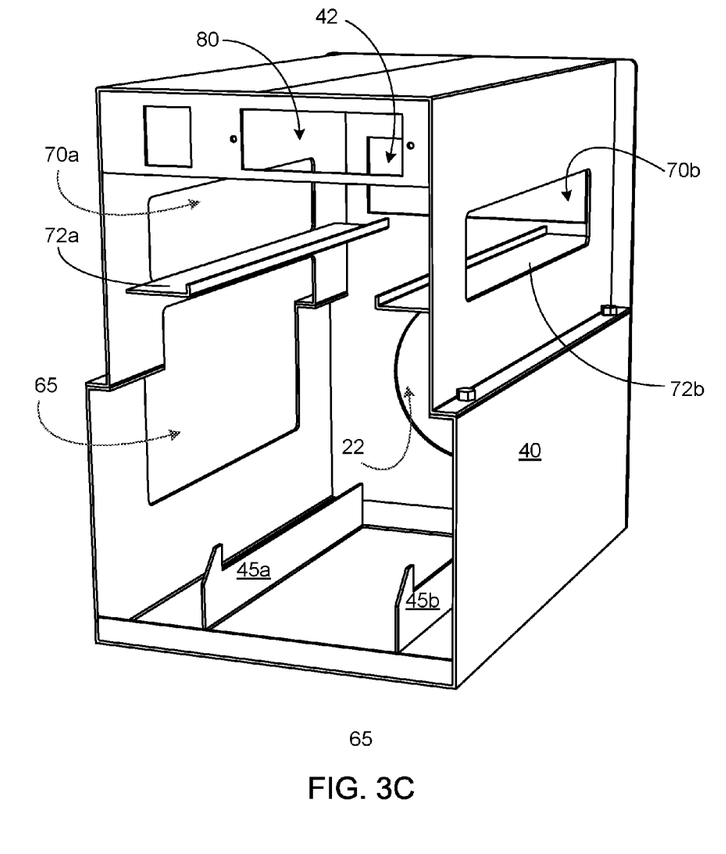
Figure 3D:
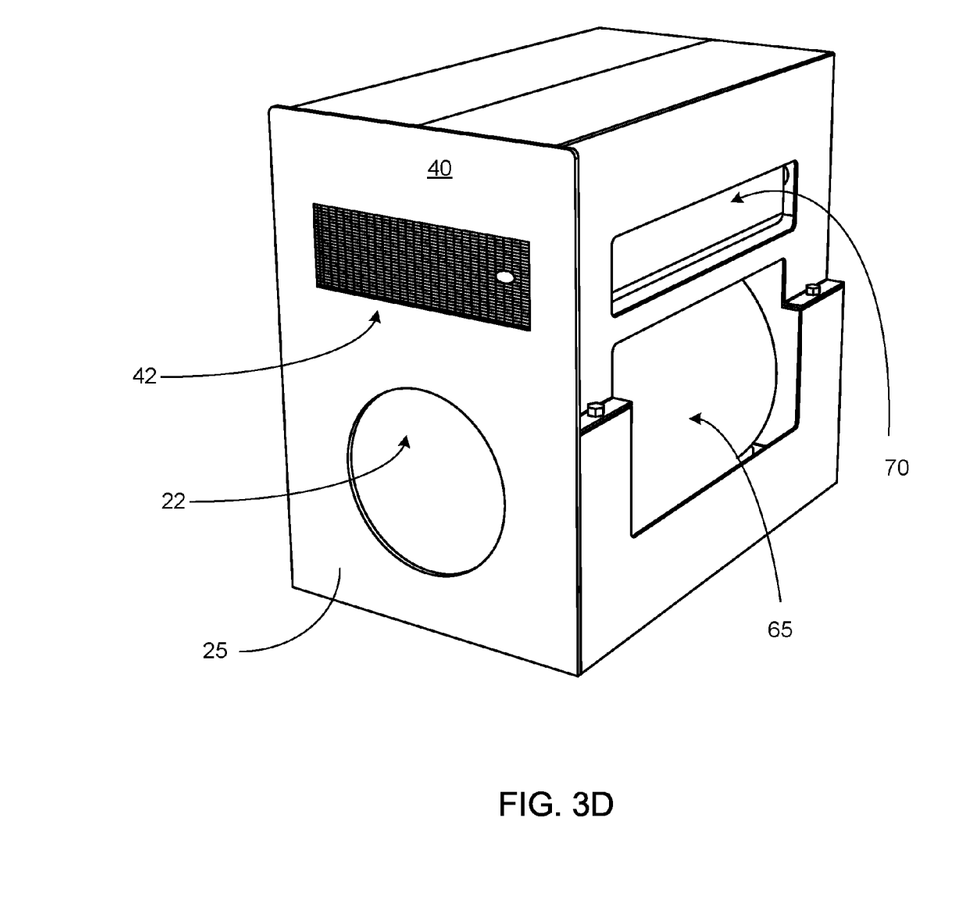

Still referring to FIG. 3, in various embodiments, the front 25 (e.g., outward facing with respect to the shelf) of the cylindrical form enclosure may include two openings: a rectangular opening 80 to promote airflow around the network adapter and permit access to the controls of the network adapter and a round opening 22 to promote airflow around the Mac Pro computer (as shown in FIG. 3D). According to various embodiments, the back (e.g., inward facing with respect to the shelf) of the cylindrical form enclosure may be completely open to promote airflow around the network adapter and Mac Pro computer (as shown in FIG. 3A). In various embodiments, one side of the cylindrical form enclosure may include two large openings: a first one 70 to promote airflow around the network adapter and a second one 65 to promote airflow around the Mac Pro computer and permit access to the controls and ports of the Mac Pro computers (as shown in FIG. 3B). Further, in one embodiment, the other side of the cylindrical form enclosure may include one opening to promote airflow around the network adapter (as shown in FIG. 3C).

In various embodiments, the bottom of the cylindrical form enclosure (e.g., the side contacting the mounting shelf) may contain a large opening 47 to promote airflow around the Mac Pro computer. The opening 47 may be defined by rails 45a, 45b, which are formed during fabrication of the enclosure 40. In one embodiment, two resting supports or rails 45a, 45b run the length of the large opening in the bottom of the cylindrical form enclosure and extend upwardly therefrom. Generally, the resting supports or rails 45a, 45b provide two points of contact on which a Mac Pro computer sits. As will be appreciated by one having ordinary skill in the art, these resting supports or rails 45 prevent the Mac Pro computer from moving while also limiting the amount of contact with the surface of the Mac Pro computer, which are challenges unique to the cylindrical form of the Mac Pro computer. Generally, increased contact with the surface of the Mac Pro computer results in decreased temperature control because of residual heat in the metal of the enclosure and decreased airflow around the Mac Pro computer. According to various embodiments, the top of the cylindrical form enclosure may include a solid panel without any openings (as shown in FIG. 3D).

Figure 4:
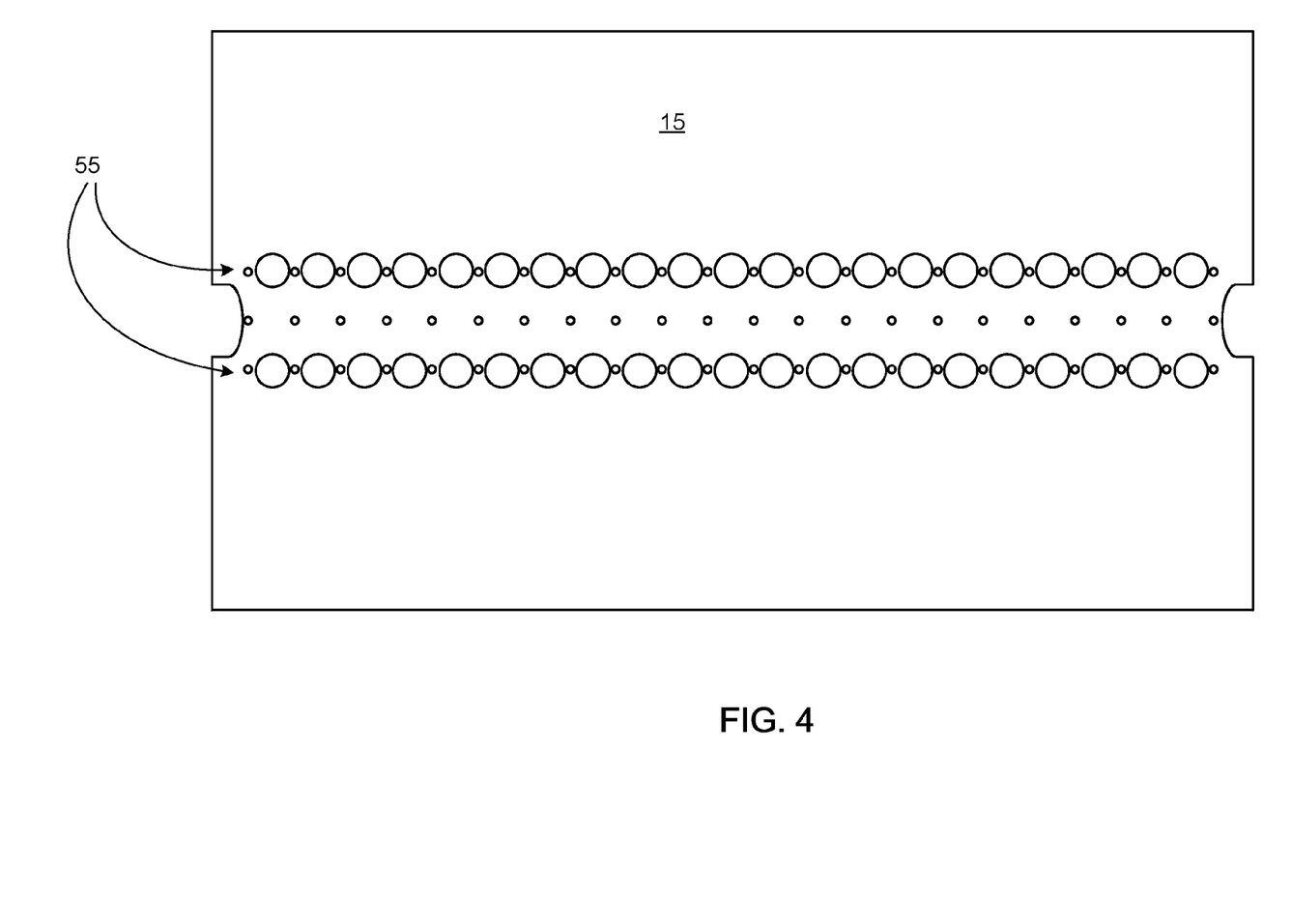
FIG. 4 is a top plan view of a mounting shelf, without cylindrical form enclosures.

FIG. 4 is a top plan view of a mounting shelf 15, without cylindrical form enclosures. In various embodiments, the mounting shelf may comprise small holes between the mounting locations where cylindrical form enclosures would be mounted. In various embodiments, the mounting shelf may comprise larger holes 55 directly behind the mounting location (e.g., in the interior of the shelf) that permit additional airflow and provide a location for cables to run between shelves. As discussed in the description of FIG. 2, the mounting shelf may comprise two small holes (not shown in FIG. 4) at each mounting location for accepting posts from the cylindrical form enclosures that seat the cylindrical form enclosures on the mounting shelf.

Figure 5:
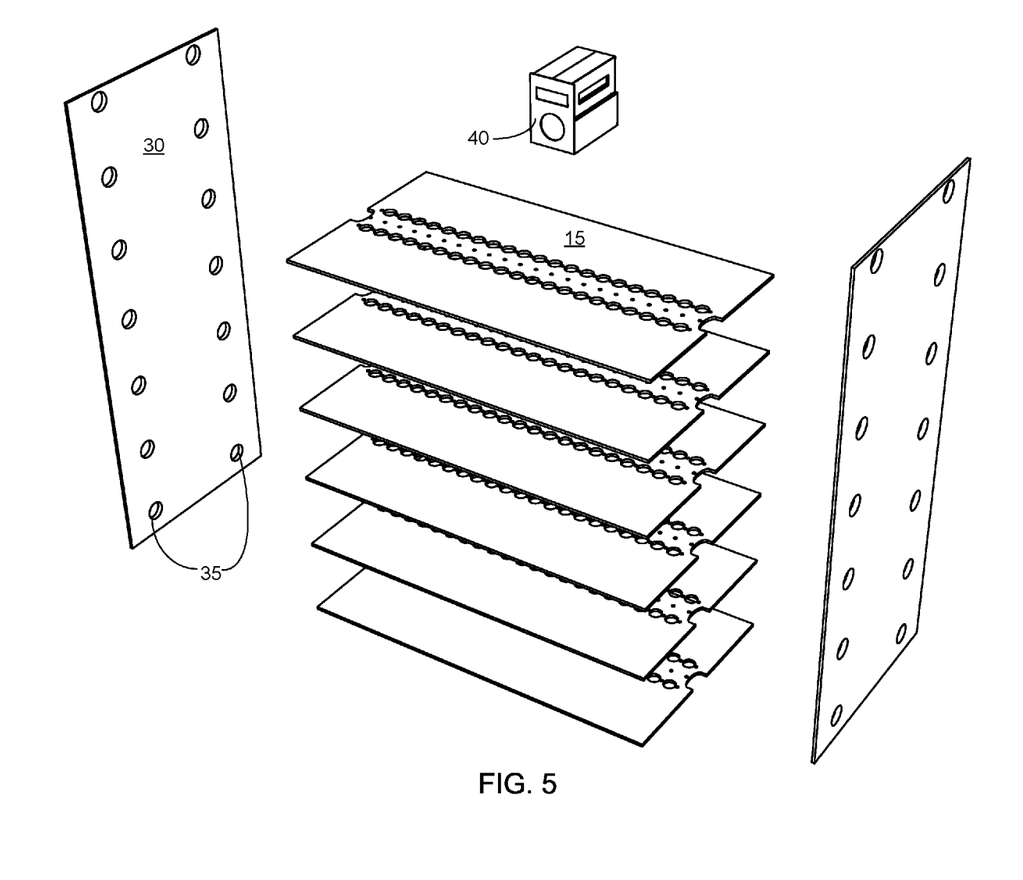
FIG. 5 is an exploded view of a complete 6-shelf data center mounting rack.

FIG. 5 is an exploded view of a complete 6-shelf data center mounting rack 10, illustrating how the mounting rack is constructed. In various embodiments, the side panel 30 contains large holes 35 for cables to run through and to promote adequate airflow. As will be appreciated by one having ordinary skill in the art, these holes may be spaced evenly with the shelves of the data center mounting rack.

From the foregoing, it will be understood that the spacing of the cylindrical form enclosures, dimensions and spacing of the staggered openings for air flow in between the cylindrical form enclosures, spacing of the shelves relative to each other, openings in side panels for cabling of communications and power, slide-in mounting arrangement, side-panel mounting for power and telecommunications components, front and rear accessibility for dual side mounting of computers, all contribute to a novel and nonobvious arrangement for cylindrical form data center computers such as Mac Pros, in a highly optimal configuration to include as many computers as possible given a floor footprint, cabling access and routing, and cooling air flow capability to maintain the array within specified operating temperatures in the data center.

The foregoing description of the exemplary embodiments has been presented only for the purposes of illustration and description and is not intended to be exhaustive or to limit the inventions to the precise forms disclosed. Many modifications and variations are possible in light of the above teaching.

The embodiments were chosen and described in order to explain the principles of the inventions and their practical application so as to enable others skilled in the art to utilize the inventions and various embodiments and with various modifications as are suited to the particular use contemplated. Alternative embodiments will become apparent to those skilled in the art to which the present inventions pertain without departing from their spirit and scope. Accordingly, the scope of the present inventions is defined by the appended claims rather than the foregoing description and the exemplary embodiments described therein.

What is claimed is:

1. A data center mounting rack for mounting and supporting a plurality of special physical form computer systems in an arrangement of vertically stacked horizontal mounting shelves that each hold a row of special form computer systems, each of the special form computer systems configured to be oriented in an upright position, comprising:
   a shelving arrangement comprising a pair of spaced apart vertical end panels supporting a plurality of horizontal mounting shelves,
   each of the horizontal mounting shelves including a pair of rows of air flow openings positioned in a central region of each of the mounting shelves for allowing the passage therethrough of cabling for computers mounted to one of said mounting shelves and for permitting cooling air flow in a vertical direction;
   each of the horizontal mounting shelves including computer system mounting enclosure surfaces along outer regions of each of the mounting shelves;
   a plurality of box-like computer system mounting enclosures mounted along the computer system mounting enclosure surfaces;
   each of the box-like computer system mounting enclosures comprising:
      a lower computer system mounting region and an upper network adapter mounting region;
      the lower computer system mounting region comprising a pair of spaced apart mounting rails extending upwardly from a bottom surface of the lower computer system mounting region, for supporting one of the plurality of special form computer systems in a sideways orientation;
      the upper network adapter mounting region comprising a pair of side walls and a pair of spaced apart subshelves extending from said side walls of the mounting enclosure adapted to support a network adapter in a position suspended above the special form computer system in the sideways orientation; and
      a front surface including a cylindrical opening positioned adjacent one of the plurality of special form computer systems when the computer system is mounted within the mounting enclosure, an axis of the special form computer system being aligned with an axis of the cylindrical opening when the computer system is mounted.

2. The data center mounting rack of claim 1, wherein the special physical form computer systems are cylindrical form computer systems.

3. The data center mounting rack of claim 2, wherein the cylindrical form computer systems are Apple Mac Pro computers.

4. The data center mounting rack of claim 1, wherein the air flow openings are positioned adjacent a rear surface of one of the plurality of computer systems mounted to one of the mounting shelves.

5. The data center mounting rack of claim 1, wherein the lower computer system mounting region comprises a rectangular air flow opening positioned between the mounting rails.

6. The data center mounting rack of claim 1, wherein each of the box-like computer system mounting enclosures comprises a rectangular air flow opening positioned between the mounting rails.

7. The data center mounting rack of claim 1, wherein the spaced apart subshelves extending from the sidewalls of the mounting enclosure extend inward from the sidewalls and comprise an upwardly bent lip at the outer most portion of each of the subshelves.

8. The data center mounting rack of claim 7, wherein the spaced apart subshelves extending from the sidewalls of the mounting enclosure create rectangular airflow openings positioned adjacent to the network adapter.

9. A box-like computer system mounting enclosure for mounting a special form computer system that is normally configured to be oriented in an upright position in a sideways orientation on a computer center data rack having a computer system mounting enclosure surface, comprising:

a lower computer system mounting region and an upper network adapter mounting region;

the lower computer system mounting region comprising a pair of spaced apart mounting rails extending upwardly from a bottom surface of the lower computer system mounting region, for supporting a special form computer system in a sideways orientation;

the upper network adapter mounting region comprising a pair of side walls and a pair of spaced apart subshelves extending from said side walls of the mounting enclosure adapted to support a network adapter in a position suspended above the special form computer system in the sideways orientation; and a front surface including a cylindrical opening positioned adjacent a special form computer system when the computer system is mounted within the mounting enclosure in the sideways orientation, an axis of the computer system being aligned with an axis of the cylindrical opening when the computer system is mounted in the sideways orientation.

10. The box-like computer system mounting enclosure of claim 9, wherein the lower computer system mounting region comprises a rectangular air flow opening positioned between the mounting rails.

11. The box-like computer system mounting enclosure of claim 9, further comprising a rectangular air flow opening positioned between the mounting rails.

12. The box-like computer system mounting enclosure of claim 9, wherein the spaced apart subshelves extending from the sidewalls of the mounting enclosure extend inward from the sidewalls and comprise an upwardly bent lip at the outer most portion of each of the subshelves.

13. The box-like computer system mounting enclosure of claim 12, wherein the spaced apart subshelves extending from the sidewalls of the mounting enclosure create rectangular airflow openings positioned adjacent to the network adapter.

14. The box-like computer system mounting enclosure of claim 9, wherein the lower computer system mounting region is fabricated by a punch cut unitary sheet of metal.

15. The box-like computer system mounting enclosure of claim 9, wherein the upper network adapter mounting region is fabricated by a punch cut unitary sheet of metal.

* * * * *